United States Patent [19]
Janko et al.

[11] Patent Number: 4,891,585
[45] Date of Patent: Jan. 2, 1990

[54] MULTIPLE LEAD PROBE FOR INTEGRATED CIRCUITS IN WAFER FORM

[75] Inventors: Bozidar Janko, Portland; Kenneth R. Smith, Aloha, both of Oreg.

[73] Assignee: Tektronix, Inc., Beaverton, Oreg.

[21] Appl. No.: 904,600

[22] Filed: Sep. 5, 1986

[51] Int. Cl.$^4$ .......................... G01R 31/02; G01R 1/06
[52] U.S. Cl. .................. 324/158 P; 324/72.5; 324/158 F
[58] Field of Search ................ 324/158 P, 158 F, 72.5

[56] References Cited

U.S. PATENT DOCUMENTS

| | | | |
|---|---|---|---|
| 3,405,361 | 10/1968 | Kattner et al. | 324/158 P |
| 3,596,228 | 7/1971 | Reed, Jr. | 324/158 P |
| 3,832,632 | 8/1974 | Ardezzone | 324/158 P |
| 4,636,722 | 1/1987 | Ardezzone | 324/158 P |
| 4,649,339 | 3/1987 | Grangroth et al. | 324/158 F |

*Primary Examiner*—Ernest F. Karlsen
*Attorney, Agent, or Firm*—William S. Lovell; John Smith-Hill

[57] ABSTRACT

A probe assembly for use in testing an integrated circuit embodied in an integrated circuit chip in wafer form, comprises a stiff support member formed with an aperture, and a membrane. Both the support member and the membrane comprise dielectric material and portions of conductive material supported by the dielectric material in electrically-insulated relationship. The portions of conductive material of the membrane constitute inner contact elements distributed over a main face of the membrane in a pattern that corresponds to the pattern in which contact areas are distributed over the contact face of the chip under test, outer contact elements distributed about a peripheral region of the membrane in a second pattern, and transmission lines extending from the inner contact elements to the outer contact elements respectively. The portions of conductive material of the support member comprise inner contact elements distributed about the aperture in a pattern corresponding to the second pattern, and transmission lines extending from the inner contact elements of the support member for connection to testing apparatus. The membrane is secured to the support member in a manner such that the membrane overlies the aperture in the support member. The outer contact elements of the membrane are in electrically-conductive contact with respective inner contact elements of the support member. The inner contact elements of the membrane include contact bumps that project from the membrane beyond other elements that lie at a distance of less than twice the diameter of the wafer from the contact bumps.

9 Claims, 1 Drawing Sheet

MULTIPLE LEAD PROBE FOR INTEGRATED CIRCUITS IN WAFER FORM

This invention relates to a multiple lead probe for integrated circuits in wafer form.

BACKGROUND OF THE INVENTION

An important aspect of the manufacture of integrated circuit chips is the testing of the circuit embodied in the chip in order to verify that it operates according to specifications. Although the circuit could be tested after the chip has been packaged, the expense involved in dicing the wafer and packaging the individual chips makes it desirable to test the integrated circuit as early as possible in the fabrication process, so that unnecessary efforts will not be expended on faulty devices. It is therefore desirable that these circuits be tested either immediately after wafer fabrication is completed, and before separation into dice, or after dicing but before packaging. In either case, it is necessary to make electrical connection to all the circuit's external connections (usually bonding pads) in a nondestructive way, so as not to interfere with subsequent packaging and connection operations.

It is desirable that an integrated circuit be tested under its design operating conditions and to the extremes of its design performance range. In particular, typical high speed circuits are designed to operate with input and output signal bandwidths exceeding 1 GHz, and it is necessary that operation of such circuits be evaluated at these high frequencies.

A high speed wafer probe is disclosed in U.S. Pat. Application Ser. No. 318,084 filed Nov. 4, 1981. A practical implementation of the probe disclosed in that patent application is capable of supporting signal bandwidths to approximately 18 GHz, but is able to provide only a few (less than ten) connections to the chip under test. Probes that are able to provide sufficient connections for the complex integrated circuits that are currently being manufactured, having fifty to one thousand bonding pads, have inadequate bandwidth for testing high speed circuits at the extremes of their performance range.

It has previously been proposed that an integrated circuit be tested using a probe comprising a body of elastomer having conductor runs of metals deposited on one face thereof. This probe is subject to a number of disadvantages. For example, the probe is not capable of supporting signals at frequencies above a few hundred megahertz without serious signal degradation, and it has poor mechanical stability owing to the large difference in elasticity of the elastomer body and the metallic conductor runs.

Co-pending application Ser. No. 812,145 filed Dec. 23, 1985, but now abandoned the disclosure of which is hereby incorporated by reference herein, discloses a probe assembly for use in testing an integrated circuit embodied in an integrated circuit chip. The probe assembly comprises a stiff support member formed with an aperture, and an elastically-deformable membrane. Both the support member and the membrane comprise dielectric material and portions of conductive material supported by the dielectric material in electrically-insulated relationship. The portions of conductive material of the membrane constitute inner contact elements distributed over a first main face of the membrane in a first pattern that corresponds to the pattern of contact areas on the contact face of the integrated circuit chip, outer contact elements distributed about a peripheral region of the membrane in a second pattern, and transmission lines extending from the inner contact elements to the outer contact elements respectively. The portions of conductive material of the support member comprise inner contact elements that are distributed about the aperture in a pattern corresponding generally to the second pattern, and transmission lines extending from the inner contact elements of the support member to testing apparatus. The membrane is secured to the support member so that it extends over the aperture, and the outer contact elements of the membrane are electrically connected to respective inner contact elements of the support member.

In a practical form of the probe assembly disclosed in co-pending application Ser. No. 06/812,145 , the support member is a circuit board that is disposed horizontally in use, and the inner contact elements of the support member are exposed at the upper surface of the support member. The outer contact elements of the membrane are exposed at the first main face of the membrane, and the membrane is clamped at its peripheral region to the upper surface of the support member using a body of elastomer material that spans the aperture in the support member. The first main face of the membrane is presented downwards, towards the interior of the aperture in the support member, and the chip is placed on a chip support that is sufficiently small to enter the aperture in the support member. The body of elastomer material has a downwardly-projecting protuberance that engages the membrane directly above the inner contact elements, so that when the pedestal is raised and the contact areas of the chip engage the inner contact elements of the membrane, upward deformation of the membrane is resisted in a resiliently yieldable fashion and the body of elastomer material supplies contact force for achieving pressure contact between the contact areas of the chip and the inner contact elements of the membrane. The maximum linear dimension of the aperture in the support member is smaller than the diameter of a standard semiconductor wafer. Because the support member is located below the membrane, and the inner contact elements are exposed to the chip under test through the aperture in the support member, the probe assembly is not well suited for testing integrated circuits in wafer form.

In the probe assembly disclosed in co-pending application Ser. No. 06/812,145 application, the transmission lines of the probe head are in a microstrip configuration, with the ground conductor on the opposite side of the membrane from the signal conductors, i.e. on the upper surface of the membrane. In a modification of the probe assembly, the transmission lines may be in microstrip configuration in a peripheral region of the film and in coplanar configuration (both the ground conductor and the signal conductors on the same side of the film) or grounded coplanar configuration (similar to coplanar configuration except that a ground plane is provided on the opposite side of the film from the signal conductors and is connected by plated through-holes to the ground conductor that is on the same side of the film as the signal conductors) closer towards the central region of the film. The transition is accomplished by providing vias through the film between the ground conductor on the lower surface of the film and the ground conductor on the upper surface of the film. Use of coplanar or grounded coplanar transmission lines has the advantage over the pure microstrip configuration of reducing cross-talk between the signal conductors and also possibly reducing losses because a greater part of field that is generated by a signal propagating along the transmission lines is in air rather than in the dielectric material of the film. However, formation of the vias requires an additional photoprocessing operation.

SUMMARY OF THE INVENTION

In accordance with the invention, a probe for use in testing an integrated circuit chip comprises a stiff support member formed with an aperture, and an elastically-deformable membrane. The membrane has first and second main faces, and is attached at its first main face to the support member so as to extend over the aperture. Both the support member and the membrane comprise dielectric material and portions of conductive material supported by the dielectric material in electrically-insulated relationship. The portions of conductive material of the membrane constitute inner contact elements exposed at the second main face of the membrane in a first pattern that corresponds to the pattern of contact areas on the contact face of the integrated circuit chip, outer contact elements distributed about a peripheral region of the membrane in a second pattern, and transmission lines extending from the inner contact elements to the outer contact elements respectively. The portions of conductive material of the support member comprise inner contact elements that are distributed about the aperture in a pattern corresponding generally to the second pattern, and transmission lines extending from the inner contact elements of the support member to testing apparatus. The outer contact elements of the membrane are electrically connected to respective inner contact elements of the support member. The inner contact elements of the membrane each include a localized contact bump of conductive material, and the bumps project farther in the direction from the first main face of the membrane towards the second main face thereof than any other parts of the probe that are at a distance from the contact bumps that is less than the diameter of the wafer including the chip under test.

BRIEF DESCRIPTION OF THE DRAWING

For a better understanding of the invention, and to show how the same may be carried into effect, reference will now be made, by way of example, to the accompanying drawings in which.

In the different figures, like reference numerals denote corresponding elements.

DETAILED DESCRIPTION

Figure 1:
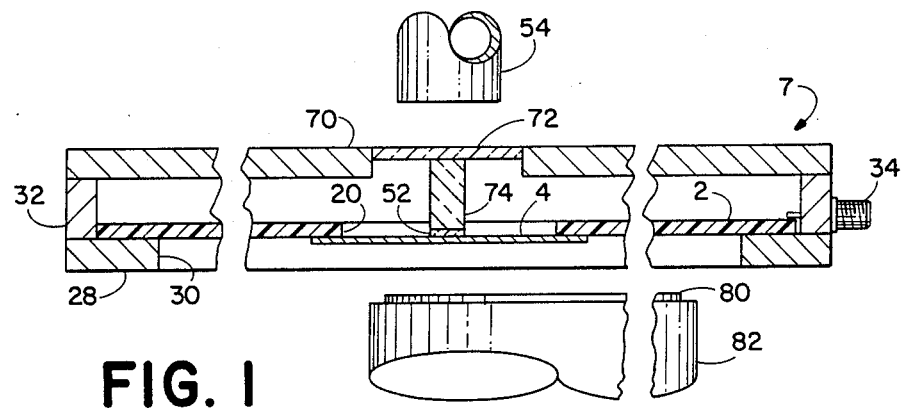
FIG. 1 is a partial sectional view of a second probe assembly embodying the present invention.
Figure 2:
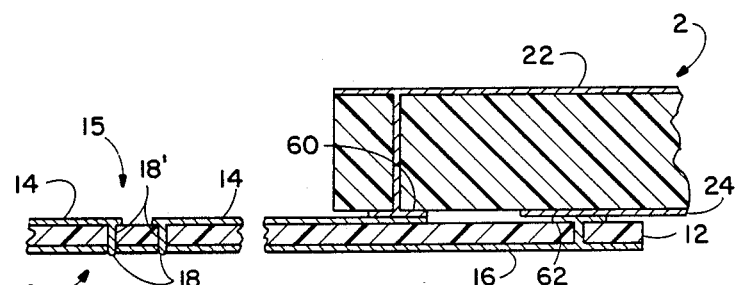
FIG. 2 is an enlarged view of a detail of FIG. 1, and FIG. 3 a view similar to FIG. 2 of an alternative construction of the detail shown in FIG. 2.

The probe assembly shown in FIGS. 1 and 2 comprises a printed circuit board 2, a film probe head 4, and a mechanical support structure 7. A wafer 80 including an integrated circuit chip that is to be tested is mounted on a wafer support 82. The chip has contact pads (not shown) distributed over its upper face. The face of the chip over which the contact pads are distributed is referred to herein as the contact face of the chip.

The probe head 4 comprises a film 12 (FIG. 2) of flexible, transparent dielectric material, such as polyimide. A pattern of electrically conductive material is formed on the film 12 using standard photolithographic patterning and etching techniques. The pattern of conductive material comprises conductor runs 14 on the upper surface of the film 12 and a continuous ground plane 16 on the lower surface of the film. The conductor runs 14 extend between a central area 15 of the film 12 and a peripheral area of the film. Contact bumps 18 of a wear resistant metal are formed at the lower ends of columns 18' of metal that extend through openings in the film 12 from the inner ends of the conductor runs 14. The openings in the film 12 are formed by conventional masking and etching techniques, and the metal of the columns 18' and the contact bumps 18 is plated into the openings. Different metals may be used for the columns 18' and the contact bumps 18, e.g., gold for the columns and nickel for the contact bumps, by using two different plating baths. It is not necessary to carry out a photoprocessing operation, i.e., a masking and selective etching operation, between formation of the openings in the film and plating of the bumps 18. The geometric distribution of the contact bumps 18 over the lower surface of the film 12 corresponds to the geometric distribution of contact pads over the contact face of the chip. Therefore, the bumps 18 can be brought into electrically-conductive pressure contact with respective contact pads of the chip. The ground plane 16 extends over the entire lower surface of the film 12, except for the central area of the film, which is left uncovered by the ground plane in order to facilitate viewing of the contact bumps from above the membrane. When the probe head is in use, the ground plane 16 is grounded, and therefore the conductor runs 14 and the ground plane 16 together constitute transmission lines extending from the contact bumps 18 to the peripheral area of the film. The film 12 is formed with plated through-holes that provide electrical connection between the ground plane 16 and pads 62 at the upper surface of the film.

The printed circuit board 2 is circular and is formed with a window 20 and comprises conductor runs 22 that extend between the periphery of the window 20 and the outer periphery of the board. The conductor runs are exposed at the upper surface of the board 2 about the periphery of the window 20, and are also exposed at the outer periphery of the board. The lower surface of the board is covered by a continuous ground plane 24. The spacing between the conductors 22 and the ground plane 24 is such that the ground plane 24 forms a transmission line with each of the conductors 22. The board 2 is formed with plated through-holes that provide electrical connection between the conductor runs 22 and pads 60 at the lower surface of the board. The pads 60 are distributed about the window 20 in a pattern that corresponds to the pattern in which the outer ends of the conductor runs 14 are distributed over the peripheral area of the film 12.

The film probe head 4 is attached to the lower surface of the board 2 by soldering the pads 60 to the outer ends of the conductor runs 14 and the pads 62 to the ground plane 24. The probe head spans the window 20, and the bumps 18 project downwardly from the probe head.

The support structure 7 comprises a circular plate 28 that is formed with an opening 30. The opening is circular, and its diameter is greater than twice the diameter of the wafer 80. Around its periphery, the plate 28 is provided with an upstanding annulus 32. Thus, the circuit board 2 is received in a circular recess defined by the support structure 7. The support structure also has a top plate 70 that incorporates a transparent window 72.

A rod 74 of transparent elastomer material is interposed between the window 72 and a pressure pad 52 of hard transparent plastic material that is attached to the upper surface of the film 12 over its central region 15. The rod 74 limits upward movement of the contact bumps 28 in resiliently yieldable fashion. The annulus 32 carries coaxial connectors 34, only one of which is shown in FIG. 1, having their inner conductors connected to respective conductor runs 22 of the circuit board. The outer conductors of the connectors 34 are grounded through the support structure 7, which is also connected to, and grounds, the ground plane 24.

In use of the illustrated probe assembly, a microscope 54 is used in conjunction with an X-Y (horizontal) positioning mechanism (not shown) to position the contact bumps 18 immediately over the appropriate connection pads of a selected chip of the wafer 80. A Z (vertical) positioning mechanism is then used to bring about relative vertical movement between the probe assembly and the wafer support so as to establish pressure contact between the contact bumps 18 and the appropriate connection pads. Contact force is provided by the rod 74. The flexibility of the probe head and the elasticity of the rod 74 ensure that the pressure contact will not damage the wafer, and also compensate for minor variations in the vertical positions of the connection pads and/or the contact surfaces of the bumps 18. When the first chip has been tested, the positioning mechanism automatically moves the wafer support to bring the next chip to be tested beneath the contact bumps, and that chip is then tested. Because the ground plane lies between the conductor runs 14 and the wafer 80, the chip under test is shielded from being influenced by signals on the conductor runs 22, and the impedance of the transmission lines including the conductor runs remains constant as the distance between the probe head and the wafer support 82, which is made of metal, changes.

The configuration of the probe head 4 allows a uniform characteristic impedance to be achieved substantially all the way to the ends of the conductor runs 14 (without resort to use of a coplanar or grounded coplanar transmission line configuration) and requires fewer photoprocessing steps to manufacture the probe head than does the hybrid coplanar/microstripline modification of the probe disclosed in co-pending application Ser. No. 06/812,145 . In particular, formation of the holes in the film 12 and plating of the metal into the holes to form the columns 18' and the contact bumps 18 is accomplished using the same photoprocessing step, whereas two photoprocessing steps are required in the case of coplanar/microstripline modification of the probe head of the co-pending application, the first being used to define the vias for the transition between microstripline configuration and coplanar configuration and the second being used to define the areas onto which the bumps are to be plated.

No element of the probe assembly that lies within the opening 30 projects downwards beyond the bumps 18. It will be noted that the opening 20 in the circuit board 2 is substantially smaller than the opening 30, but because the membrane is attached to the underside of the circuit board the board does not interfere with testing chips of a wafer that is larger than the opening 20.

Figure 3:
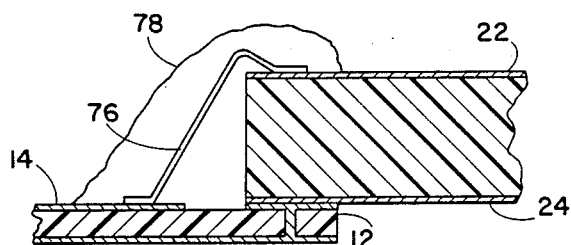

FIG. 3 illustrates a modified technique for connecting the conductor runs 22 of the circuit board 2 to the runs 14 of the probe head 4. As shown in FIG. 3, bondwires 76 are used to interconnect the runs 14 and 22. Generally, multiple bondwires are required for each connection in order to maintain a uniform characteristic impedance, and the bondwires are encapsulated in potting compound 78 in order to prevent relative movement of the bondwires. Conventional microwave design techniques are used to determine the number, length and spacing of the bondwires.

In the illustrated probe assembly, the characteristic impedance of the transmission lines of the probe head is matched to that of the transmission lines of the circuit board, and therefore a high integrity signal path is provided between the contact pads of the chip and the coaxial connectors 34.

The illustrated probe assembly provides several advantages over known probe assemblies. For example, it is possible to provide several hundred high integrity connections to a single integrated circuit chip without difficulty. The probe head itself is inexpensive and readily replaceable and can be manufactured using conventional techniques. In addition, the probe head is not easily damaged by contact with the chip under test and such contact does not damage the chip.

The transmission lines on the circuit board 2 and probe head 4 may be used to provide power supply and ground connections as well as signal connections to the chip under test. In the case of a power supply connection, it is desirable that the transmission line taper over the probe head, e.g. from 5 $\Omega$ characteristic impedance at the periphery of the probe head to 50 $\Omega$ characteristic impedance close to the column 18', and have a non-infinitesimal resistivity, in order to establish a desired RC time constant for damping power supply transients before they reach the chip under test.

It will be appreciated that the present invention is not restricted to the particular probe assembly that has been described and illustrated, and that variations may be made therein without departing from the scope of the invention as defined in the appended claims and equivalents thereof. For example, because the conductor runs 14 of FIGS. 1-3 are accessible from the top of the probe head 4, mounting active or passive circuit elements in the signal path is facilitated. An active element, e.g., a high input impedance amplifier, might be used to provide a high impedance load to the circuit under test while using a low impedance transmission line for conducting signals to the coaxial connectors. Alternatively, active elements on the probe head 4 may be used to allow the interaction between two chips on the same wafer to be tested. Passive circuit elements might be used to provide termination resistance and by-pass capacitance for the transmission lines. Also, it is not necessary that the area of the polyimide film 12 be restricted to being just slightly greater than the opening 20, and the film may extend right out to the periphery of the board 2. If the connections between the transmission lines of the probe head and those of the board are made in the manner shown in FIG. 2, the connection may then be spaced from the opening in the circuit board. The printed circuit board shown in the drawings may be replaced by a ceramic hybrid circuit. It is not necessary that the probe head and its support member should have a planar configuration, and a dished configuration, e.g., may be used instead. In such a case, the support member may be a dished plate of aluminum. The probe head would need to be contoured to conform to the dishing of the plate, and in the case of a polyimide probe head this may be achieved by slitting. If an automatic stepping mechanism is used for positioning the wafer relative to the probe assembly, it is not necessary that the probe head be transparent. Of course, the contact pads of the chip may be at the interior of the contact face as well as about the periphery of the contact face.

We claim:

1. A probe assembly for use in testing an integrated circuit embodied in an integrated circuit chip that is incorporated in a wafer, comprising:

a stiff support member having at least one face and formed with an aperture in that face, the support member comprising dielectric material and portions of conductive material supported by the dielectric material in electrically-insulated relationship, the portions of conductive material of the support member comprising a plurality of inner contact elements distributed about said aperture in a first pattern, and a plurality of transmission lines extending from the inner contact elements of the support member for connection to testing apparatus, and a membrane having first and second opposite main faces and comprising dielectric material and portions of conductive material supported by the dielectric material in electrically-insulated relationship, the portions of conductive material of the membrane constituting a plurality of inner contact elements distributed over said first main face of the membrane in a pattern that corresponds to the pattern in which contact areas are distributed over the contact face of the chip under test, a plurality of outer contact elements distributed about a peripheral region of the membrane in a pattern corresponding generally to said first pattern, and a plurality of transmission lines extending from said inner contact elements to said outer contact elements respectively, the membrane being secured at one of its main faces to the support member in a manner such that the membrane overlies said aperture, the outer contact elements of the membrane being in electrically-conductive contact with the respective inner contact elements of the support member and the inner contact elements of the membrane including contact bumps that project from the membrane at the first main face thereof beyond other elements of the probe assembly that lie at a distance of less than twice the maximum linear dimension of the wafer from the contact bumps.

2. A probe assembly according to claim 1, wherein said support member comprises a printed circuit board and the portions of conductive material of the circuit board constitute a plurality of microstrip transmission lines.

3. A probe assembly according to claim 1, wherein the outer contact elements of the membrane are exposed at one main face of the membrane, and the transmission lines that are constituted by the portions of conductive material of the membrane are microstrip transmission lines comprising conductor runs at said one main face of the membrane and a ground plane at the opposite main face of the membrane.

4. A probe assembly according to claim 3, wherein said one main face of the membrane is the second main face thereof.

5. A probe assembly according to claim 4, wherein the support member is a printed circuit board having first and second opposite main faces, said one face of the circuit board being said first main face thereof, and wherein the portions of conductive material of the support member comprise a ground plane on the first main face of the circuit board and a plurality of conductor runs on the second main face thereof.

6. A probe assembly according to claim 5, wherein the portions of conductive material of the membrane comprise pads on the second main face of the membrane and conductive material extending through the membrane and connecting the pads to the ground plane of the membrane, the pads being metallurgically bonded to the ground plane of the circuit board.

7. A probe assembly according to claim 5, wherein the portions of conductive material of the support member comprise pads on said first main face of the circuit board and conductive material extending through the board and connecting the conductor runs of the circuit board to respective pads thereof, the pads of the circuit board being metallurgically bonded to the outer contact elements of the membrane.

8. A probe assembly according to claim 5, further comprising a support structure in which the support member is mounted, said support structure comprising a plate that extends parallel to the circuit board in spaced relationship therewith and on the opposite side of the circuit board from the membrane, and wherein the membrane is flexible and the assembly comprises a body of elastomeric material effective between the plate and the membrane whereby movement of the inner contact elements in the direction towards the body of elastomeric material is resisted in resiliently yieldable fashion.

9. A probe assembly according to claim 1, wherein the membrane is secured at its second main face to the support member and said second main face of the membrane is in confronting relationship with said one face of the support member.

* * * * *